(12) United States Patent
Thevenard et al.

(10) Patent No.: US 7,804,695 B2
(45) Date of Patent: Sep. 28, 2010

(54) SYSTEM FOR INTERCONNECTING TWO SUBSTRATES EACH COMPRISING AT LEAST ONE TRANSMISSION LINE

(75) Inventors: Julian Thevenard, Laiz (FR); Dominique Lo Hine Tong, Rennes (FR); Ali Louzir, Rennes (FR); Corinne Nicolas, La Chapelle des Fougeretz (FR); Christian Person, Locmaria Plouzane (FR); Jean-Philippe Coupez, Le Relecq Kerhuon (FR)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/322,924

(22) Filed: Feb. 9, 2009

(65) Prior Publication Data

US 2009/0213562 A1    Aug. 27, 2009

(30) Foreign Application Priority Data

Feb. 27, 2008    (FR) .................................. 08 51246

(51) Int. Cl.
*H05K 1/11*    (2006.01)
*H01R 12/16*    (2006.01)
*H01R 12/04*    (2006.01)

(52) U.S. Cl. ............... 361/803; 361/785; 361/786; 361/788; 361/784; 174/267; 174/262

(58) Field of Classification Search ......... 174/262–266, 174/360, 267; 439/65, 44; 361/785, 786, 361/788, 803
See application file for complete search history.

(56) References Cited

U.S. PATENT DOCUMENTS

| 5,130,896 | A | * | 7/1992 | Babb et al. ................ 361/818 |
| 5,321,585 | A | * | 6/1994 | Trittschuh et al. ............ 361/784 |
| 5,455,742 | A | * | 10/1995 | Phoy et al. .................. 361/778 |
| 5,590,029 | A | * | 12/1996 | Estes ......................... 361/760 |
| 6,404,394 | B1 | | 6/2002 | Hill |
| 6,538,538 | B2 | * | 3/2003 | Hreish et al. ................ 333/246 |
| 7,034,544 | B2 | * | 4/2006 | Ye et al. ..................... 324/534 |
| 7,149,092 | B2 | * | 12/2006 | Iguchi ........................ 361/780 |

(Continued)

FOREIGN PATENT DOCUMENTS

DE    20 2006 020076 U 1    10/2007

(Continued)

OTHER PUBLICATIONS

Search Report Oct. 24, 2008.

*Primary Examiner*—Jeremy C Norris
*Assistant Examiner*—Steven Sawyer
(74) *Attorney, Agent, or Firm*—Robert D. Shedd; Harvey D. Fried; James McKenzie

(57) ABSTRACT

The present invention relates to an interconnection system of a first substrate (1) comprising at least one first transmission line (3) with a second substrate (10) comprising at least one second transmission line (11), the orientation of the first substrate with respect to the second substrate being arbitrary. The first substrate (1) comprises at least one metallized hole at one extremity of said first line and the second substrate (10) comprises a projecting element extending said second line and a ground saving, said projecting element being inserted into the metallized hole. The invention notably applies in the domain of microwaves and can interconnect a substrate comprising a printed antenna with a substrate receiving the processing circuits of the signal.

10 Claims, 6 Drawing Sheets

U.S. PATENT DOCUMENTS

| | | |
|---|---|---|
| 7,154,356 B2 * | 12/2006 | Brunette et al. ............... 333/33 |
| 2002/0071259 A1 * | 6/2002 | Roos .......................... 361/784 |
| 2003/0236006 A1 * | 12/2003 | Yamashita ................... 439/65 |
| 2005/0011675 A1 * | 1/2005 | Barr et al. ................... 174/262 |
| 2006/0128174 A1 | 6/2006 | Jang et al. |
| 2007/0075405 A1 * | 4/2007 | Ye .............................. 257/666 |
| 2007/0096995 A1 * | 5/2007 | Lee ..................... 343/700 MS |

FOREIGN PATENT DOCUMENTS

| | | |
|---|---|---|
| WO | WO 01/11931 A | 2/2001 |

* cited by examiner

SYSTEM FOR INTERCONNECTING TWO SUBSTRATES EACH COMPRISING AT LEAST ONE TRANSMISSION LINE

This application claims the benefit, under 35 U.S.C. §119, of European Patent Application No. 0851246 filed Feb. 27, 2008.

The present invention relates to an interconnection system of a first substrate comprising at least one first transmission line with a second substrate comprising at least a second transmission line, the orientation of the first substrate with respect to the second substrate being arbitrary.

The invention relates in a more particular manner to an interconnection system in which the transmission lines are printed lines, the interconnection system also including a filtering function.

BACKGROUND OF THE INVENTION

There is a strong demand for reducing the size of current systems while using the least expensive manufacturing methods. The present invention therefore proposes a new interconnection system of a first substrate comprising at least one first transmission line with a second substrate comprising at least on second transmission line realized by simple mechanical contact without requiring any soldering or any other means of interconnection, once the assembly is carried out.

The present invention also relates to the integration at the level of the transition between the two transmission lines of a filtering function intended to remove the parasitic frequencies emitted or received without deteriorating performances in the useful frequency bandwidths and without affecting the physical dimensions of the transition. The present invention therefore makes it possible not only to transfer the energy of a first substrate to a second substrate but also to save on size and also overall cost of the system.

The present invention can notably be applied within the framework of the interconnection of a substrate comprising printed antennas with a second substrate on which other electronic functions are realized, as described, for example, in the French patent application no. 06 55246 in the name of the applicant.

SUMMARY OF THE INVENTION

Hence, the present invention relates to an interconnection system of a first substrate comprising at least one first transmission line with a second substrate comprising at least one second transmission line, the orientation of the first substrate with respect to the second substrate being arbitrary, characterized in that the first substrate comprises at least one metallized hole at one extremity of said first transmission line and in that the second substrate comprises a projecting element extending said second transmission line, said projecting element being inserted into the metallized hole. Preferably, the hole realized on the first substrate is surrounded, on both faces of said substrate, by a non-metallized saving, and a demetallized zone is located on the back face of the second substrate. The saving between the metallized hole and a ground plane of the first substrate associated with the transmission line part crossing the saving, together with the transmission line part crossing the saving made on the second substrate forms a filtering element. This filtering element has a pseudo-elliptical low-pass type response with a transmission zero, such that the value of the resonating element is a function of the dimension of the saving made on the first substrate between the metallized hole and the ground plane, the value of a first inductive element is a function of the length of the transmission line above this saving, and the value of a second inductive element is a function of the length of the transmission line above the saving made on the second substrate.

According to another characteristic of the present invention, the transmission line of the first substrate extends beyond the metallized hole by a line element. This line element supplies a reactance at the level of the transition being able to control the resonant frequency of the filter.

According to a preferential embodiment, the part of the projecting element of the second substrate is non-metallized on the face opposite the face receiving the second feed line. Preferably, the first and second feed lines are microstrip lines, coplanar lines or tri-plate lines, and the first and second substrates are single-layer or multi-later substrates. According to preferential embodiment, the first and second substrates are positioned with respect to each other in a manner to form a 90° angle.

BRIEF DESCRIPTION OF THE DRAWINGS

Other characteristics and advantages of the present invention will emerge from reading the description of different embodiments, this description being made with reference to the attached figures, wherein.

DESCRIPTION OF PREFERRED EMBODIMENTS

Figure 1:
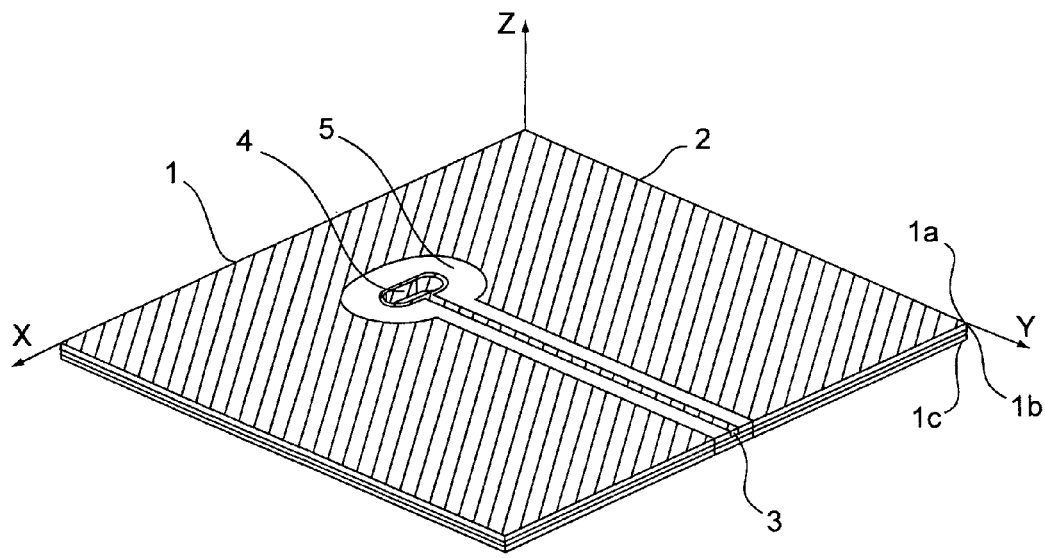
FIG. 1 is a top view of a first substrate in accordance with the present invention.
Figure 2:
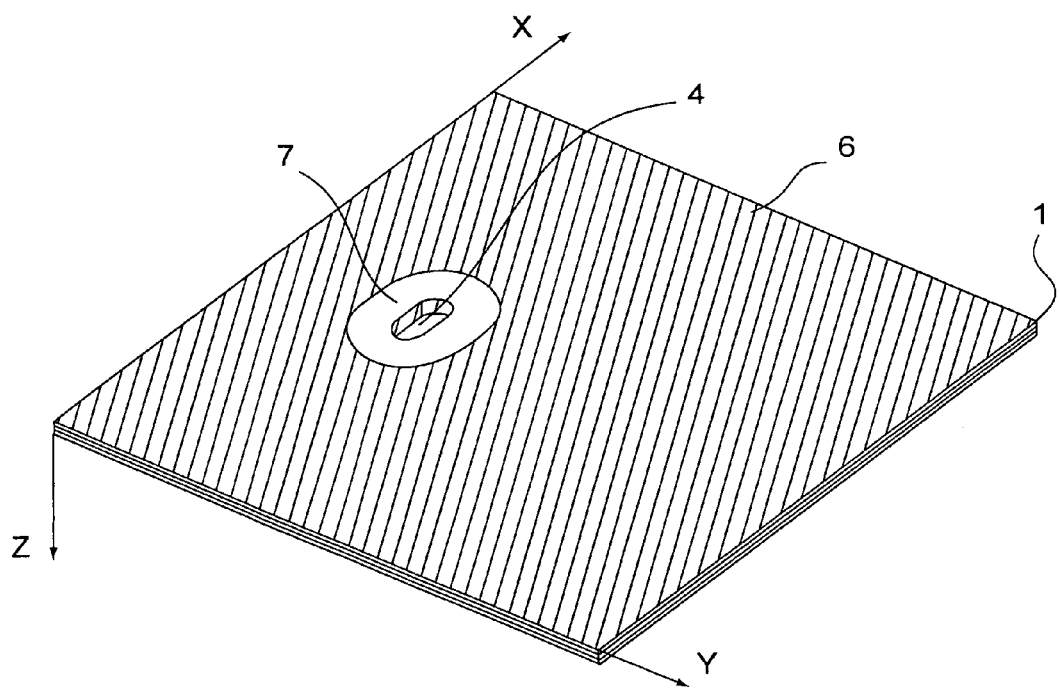
FIG. 2 is a bottom view of the substrate of FIG. 1.

A description will first be given, with reference to FIGS. 1 of 6, of a first embodiment of an interconnection system in accordance with the present invention. In FIGS. 1 and 2, a first substrate 1 formed from a multi-layer substrate 1a, 1b, 1c is shown. It is evident to those skilled in the art that the invention can also apply to a single-layer substrate. The upper face of the substrate comprises a metal layer 2.

In accordance with the present invention, a feed line 3, more particularly a microstrip line, was realized on the upper face of the substrate 1 by etching said substrate. This transmission line gives onto in a metallized hole 4. This hole 4 is surrounded by a saving 5 realized by demetallization of the metal layer 2.

On the other face of the substrate 1, namely the lower face in the embodiment shown, a layer 6 forms the ground plane. This layer 6 was demetallized in 7 around the hole 4. This ground plane is connected to the upper ground plane 2 by means of metallized holes (not shown here) placed along the transmission line 3 and around the ground saving 5. The two demetallized zones 5 and 7 around the metallized hole 4 can insulate the microstrip line and the metallized hole of the rest of the circuit and, notably, of the ground plane. Moreover, the upper saving can prevent a short-circuit and will be used to realize a filtering transition as shown below.

Figure 3:
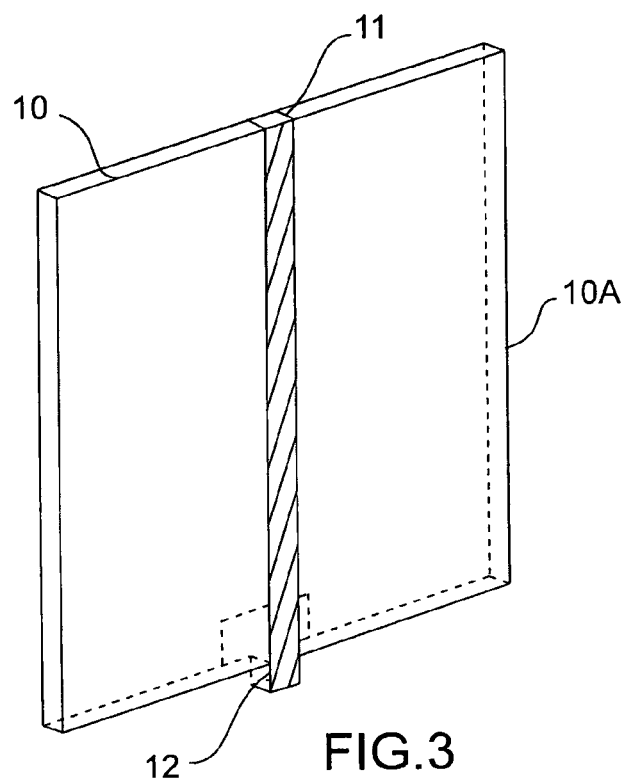
FIG. 3 is a perspective front view of a second substrate in accordance with the present invention.
Figure 4:
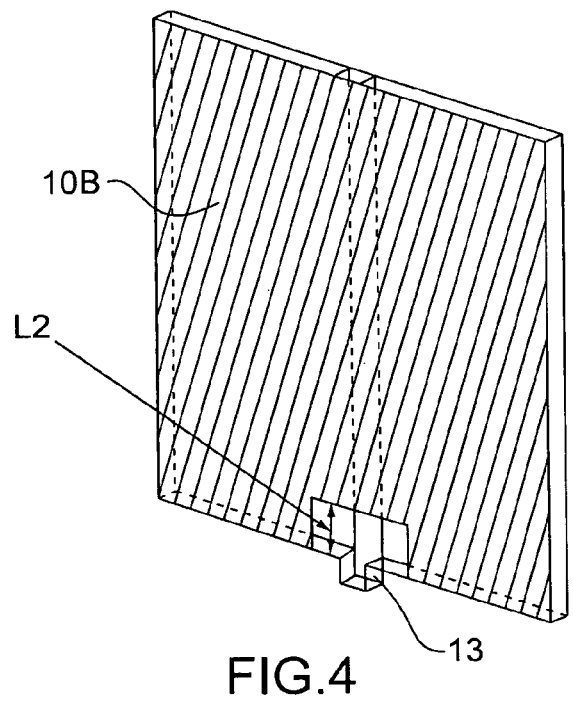
FIG. 4 is a perspective back view of the second substrate shown in FIG. 3.
Figure 5:
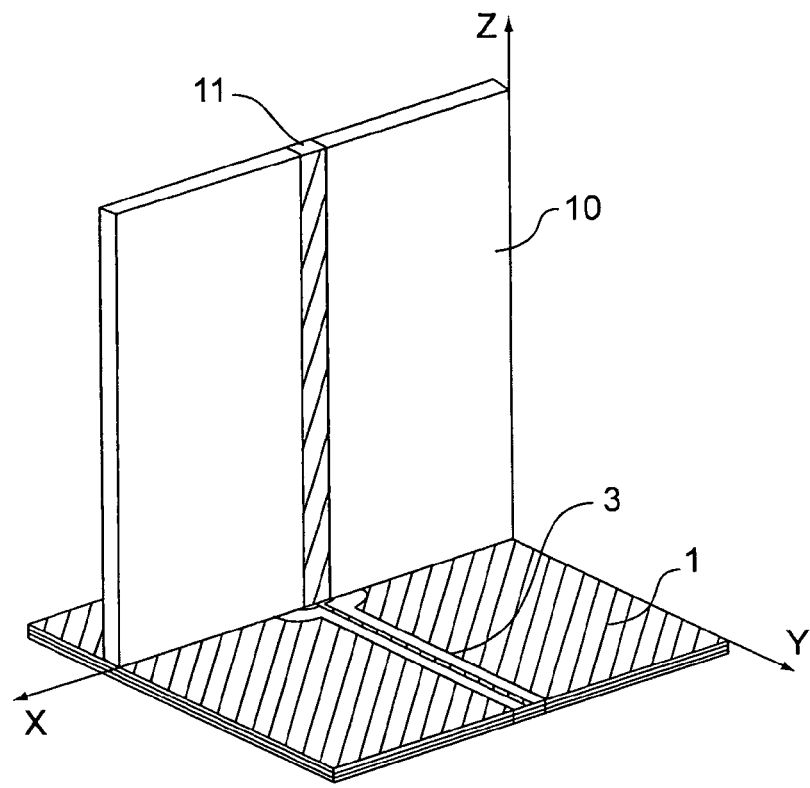
FIGS. 5 and 6 are perspective views of the system when the two substrates are interconnected in accordance with the present invention.
Figure 6:
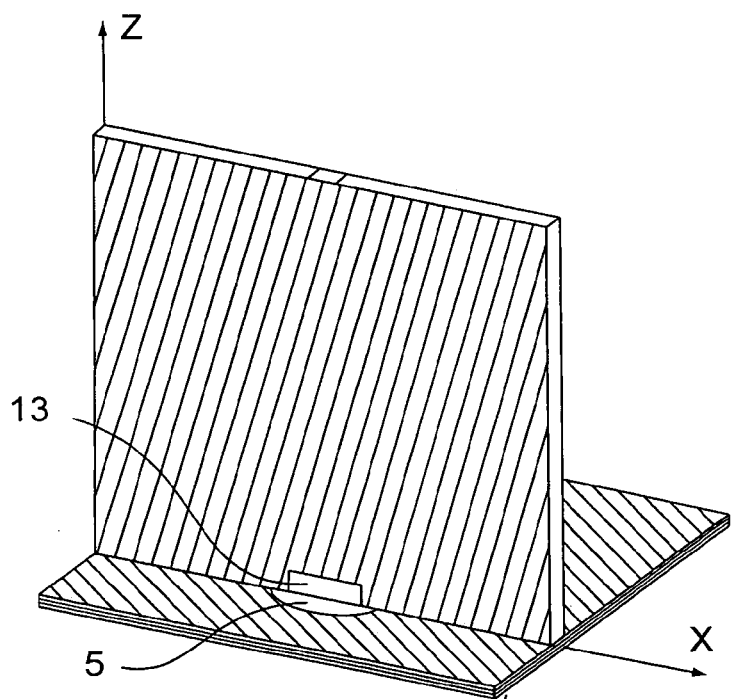

As shown in FIGS. 3 and 4, a second substrate 10, multi-layer or single-layer, has, on its upper face 10a, a metallized line 11. The substrate also comprises a projecting element 12 on which the said line 11 is realized. To prevent a short-circuit, the other face 10b of the substrate 10 comprising a ground plane is demetallized at the level of the projecting element 12 and on its upper part in such a manner as to form a saving 13. The projecting element 12 has a shape that enables it to be inserted into the metallized hole 4, as shown in FIGS. 5 and 6. As shown in FIGS. 5 and 6, the two substrates 1 and 2 are interconnected perpendicularly with respect to each other. It is evident for those skilled in the art, that an orientation other than a 90° orientation between the two substrates can also be envisaged without leaving the scope of the invention. As shown clearly in FIG. 6, the two savings 13 and 5 can prevent short-circuits.

Hence, as shown in FIGS. 5 and 6, a simple mechanical interconnection is realized between the two feed lines 3 and 11 carried respectively by the substrate 1 and the substrate 2. This assembly does not require any soldering or operation other than a simple insertion of one substrate into the other. Moreover, the mechanical properties of this interconnection can provide the transfer of energy from one substrate to the other by simple contact without having to use any soldering or other method.

Moreover, as explained below, the geometry of the transition thus realized can, at the same time, realize a filtering function. This filtering function will be explained in a more detailed manner with reference to FIGS. 7 to 10.

Figure 7:
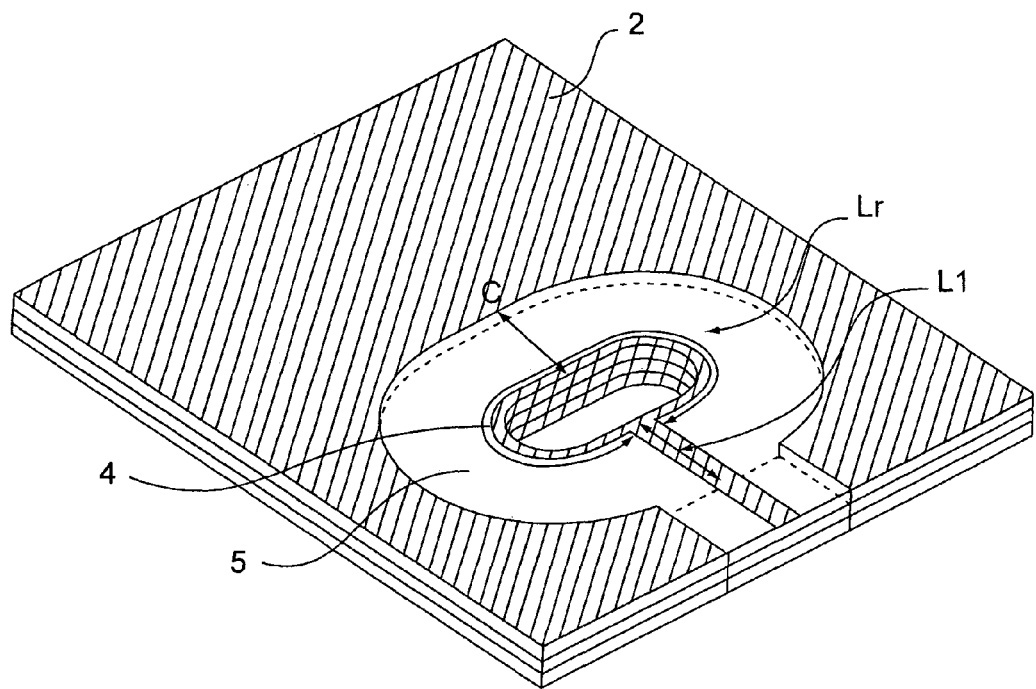
FIG. 7 is an enlarged top view showing the filtering transition associated with the interconnection system in accordance with the present invention.

As shown in FIG. 7, which is an enlarged view of FIG. 1, the filtering function is constituted by a capacitive element Cr formed between the metallized hole 4 and the upper metal part 2 of the substrate surrounding the saving 5. The value of the capacitive element depends on the distance C between the hole 4 and the part 2, as will be explained in more detail with reference to the curves of FIG. 9. The ground hole thus constitutes an inductive loop of value Lr. Moreover, the feed line above the saving 5 forms an inductive element Ls1 whose value is a function of the dimension L1 above the saving, as will be explained with reference to FIG. 10. The transmission line above the saving 13 also forms an inductive element Ls2 whose value depends on the length L2 of the ground saving made on the back plane of the line. The assembly of the transition forms a filtering network, as shown by the circuit diagram of FIG. 8. The filter comprises two self-inductances Ls1 and Ls2 in series connected between the input port P1 and the output port P2, and a resonating element Lr/Cr in series mounted between the junction point of the self-inductances and the ground m. The filter thus shown is a low-pass filter of the order 3 with a transmission zero.

Figure 9:
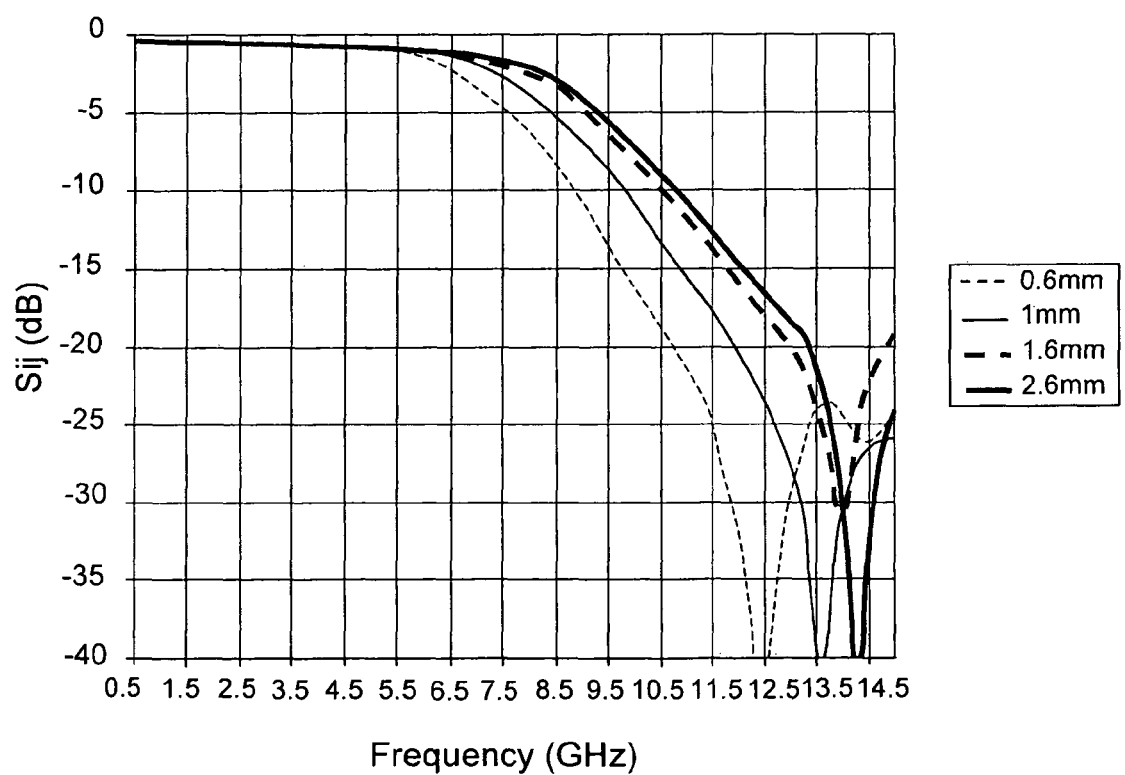
FIG. 9 shows the transmission curves of the filtering transition according to the distance C of the capacitive element.
Figure 10:
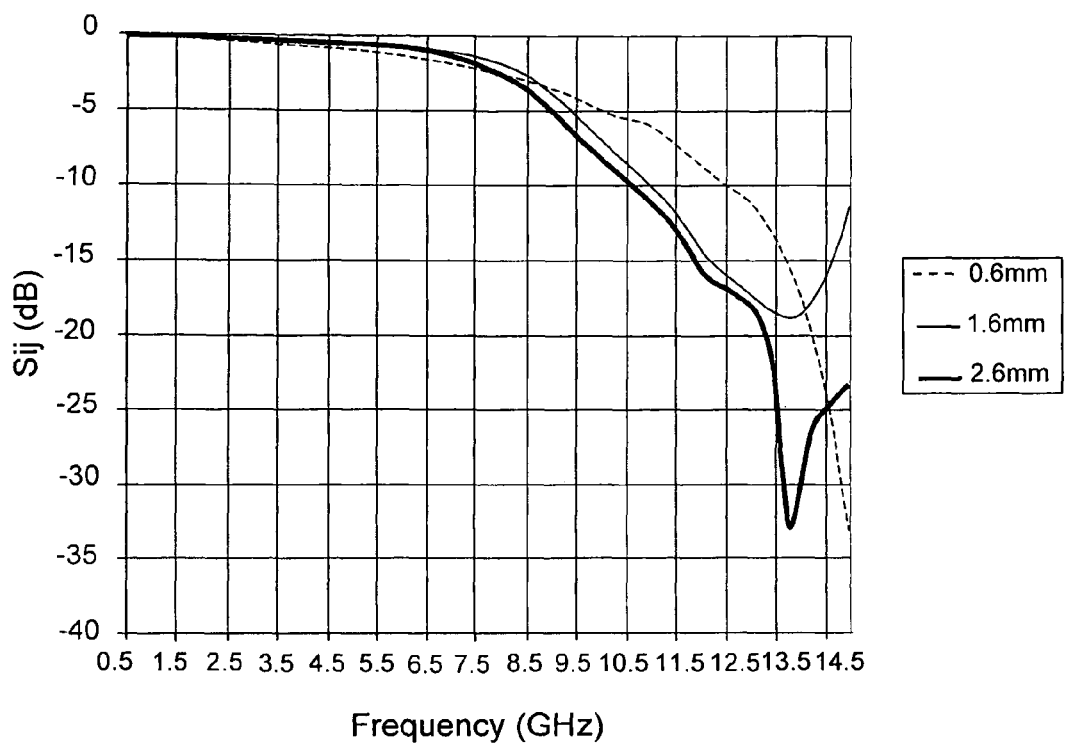
FIG. 10 shows different transmission curves of the filtering transition for different values of the distance L, namely the inductive element.

As more clearly shown in FIGS. 9 and 10, by modifying the values of C or by modifying the values of L1, it is possible to shift the cutoff frequency of the filter. Hence FIG. 9 shows different cutoff frequencies for values of C respectively of 0.6 mm, 1 mm, 1.6 mm, 2.6 mm, the value of L being constant and equal to 1.9 mm whereas FIG. 10 shows the cutoff frequency of the filtering transition for values of L respectively of 0.6 mm, 1.6 mm, 2.6 mm with a constant value of C equal to 1.9 mm. Those skilled in the art are aware that it is also possible to vary the cutoff frequency by modifying the value of the length L2, that is the value of the equivalent inductance Ls2 of the filtering network. Likewise, by modifying the dimensions of the metallized hole 4, namely the value of the equivalent inductance Lr, it is possible to modify the frequency of the transmission zero.

Figure 12:
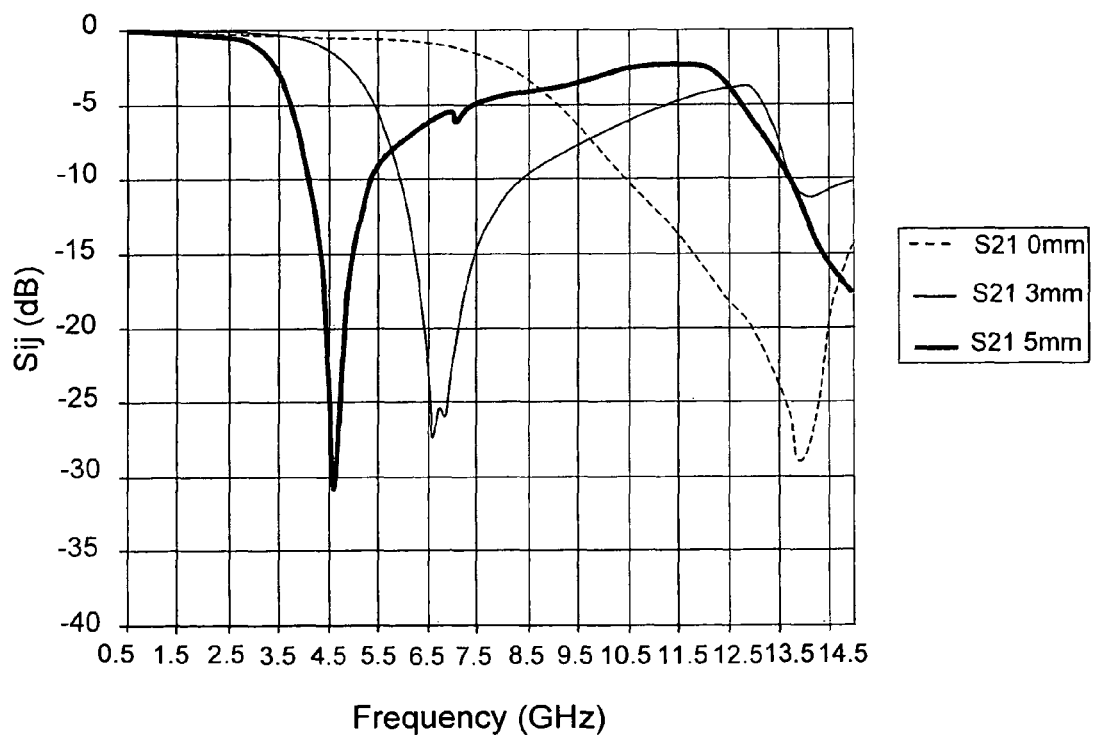
FIG. 12 gives the curves S21 of the filtering transition as a function of the frequency.

To highlight the performances of the interconnection system of the present invention, a structure operating in the bands of wireless communications applications WLAN (for Wireless Local Area Networks) particularly respond to the IEEE standards 802.11 a/b/g/n and whose frequency bands operate around 2.4 GHz and 5.5 GHz, was simulated by using the HFSS simulator of ANSOFT The horizontal substrate 1 is a substrate of the FR4 type constituted by four metal layers each spaced by 0.26 mm and supports an oblong metallized hole 4 of length 3.4 mm and width 1.5 mm. The total thickness of the horizontal substrate is 0.78 mm. It is shown in FIG. 1. The vertical substrate as shown in FIGS. 3 and 4 is constituted by a plastic substrate of the Pocan type belonging to the family of the polybuthylene terephtalate (PBT) of permittivity 3.4 and loss tangent equal to 0.01. The horizontal saving is of the same shape and has a length 6.3 mm for a width 3.8 mm. The projecting element 12 is of parallelepiped form of height 1.6 mm, depth 1.5 mm and width 1.9 mm. The rear saving 13 is rectangular and has a height L2 of 2.5 mm for a width of 5.9 mm. The results of this filtering transition are shown in FIG. 12 that gives the curves S21 of the filtering transition. In the case described above, the losses specific to the transition are less than 0.1 dB in the bandwidth. The transmission levels indicated on the curves are of the order of −0.9 dB at 6 GHz and are due to the dielectric losses in the materials.

Figure 11:
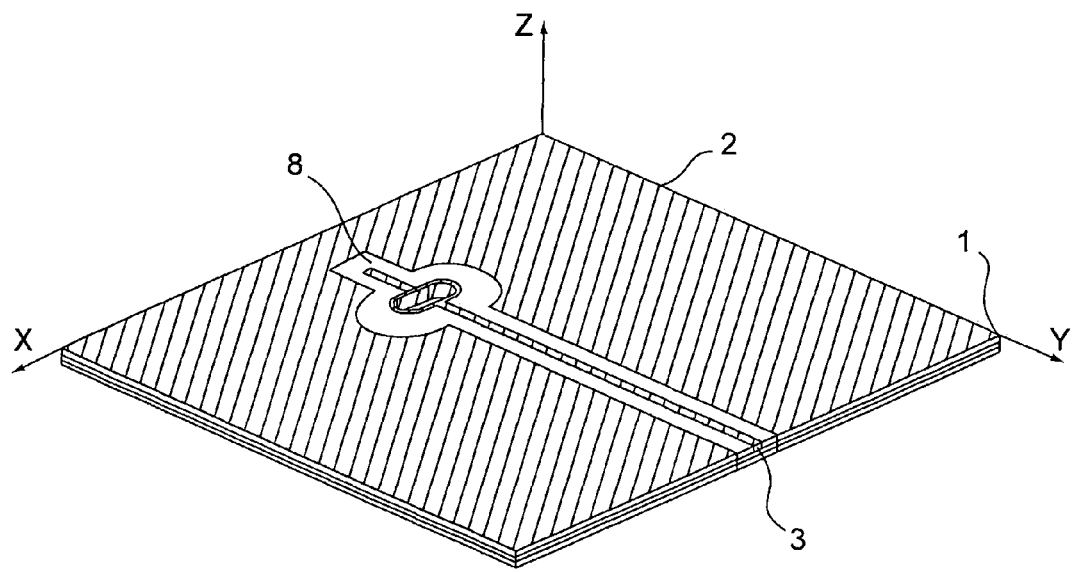
FIG. 11 shows a view of the first substrate with a modification of the filtering transition.
Figure 8:
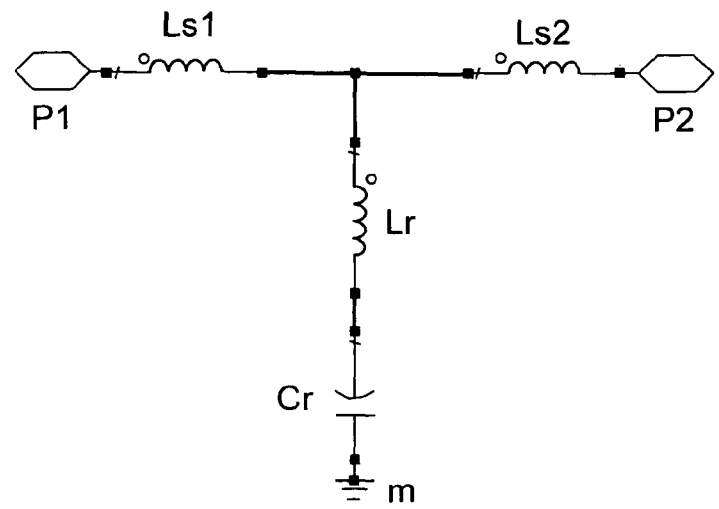
FIG. 8 is a circuit diagram of the filtering transition of FIG. 7.

As shown in FIG. 11, it is possible to add elements of the inductive or capacitive type to the filtering transition. Hence, in FIG. 11, a line element 8 extends the line 3 beyond the hole 4. This line element 8 etched in the face 2 of the substrate 1 has a length that can control the resonant frequency of the filter that is located for example at 6.7 GHz for an element of length 3 mm and an attenuation of the transmitted signal of more than 15 dB in a band of 1.3 GHz around this frequency, is generated. This added line element is a control parameter of the filter while ensuring the operation of the transition, as shown in FIG. 12.

What is claimed is:

1. An interconnection system of a first substrate comprising at least one first transmission line with a second substrate comprising at least one second transmission line, the orientation of the first substrate with respect to the second substrate being arbitrary, the first substrate comprising at least a metalized hole at an extremity of said at least one first transmission line and the hole is surrounded, on the two faces of the first substrate, by a non-metalized saving the second substrate comprising a projecting element extending from said at least one second transmission line and a ground saving, said projecting element being inserted into the metalized hole, wherein the saving formed between the metallized hole and a ground plane of the first substrate, associated with the at least one first transmission line crossing the saving together with the at least one second transmission line located on the second substrate and its opposite ground saving forms a low-pass filtering element with a zero transmission.

2. The system of claim 1, wherein the filtering element is constituted by two self-inductance elements in series and a parallel resonating element.

3. The system of claim 2, wherein the value of the resonating element is a function of the dimension of the saving between the metalized hole and the ground plane of the first substrate.

4. The system of claim 2, wherein the value of the self-inductance element of the first substrate is a function of the length of the at least one first transmission line above the saving.

5. The system of claim 2, characterized in that the value of the self-inductance element of the second substrate is a function of the length of the at least one second transmission line above the saving.

6. The system of claim 1, wherein the at least one first transmission line of the first substrate extends beyond the metalized hole by a line element.

7. The system of claim 1, wherein the part of the projecting element of the second substrate is non-metalized on the opposite face to the face receiving the at least one second transmission line.

8. The system of claim 1, wherein the at least first and second transmission lines are microstrip lines, coplanar lines, tri-plate lines.

9. The system of claim 1, wherein the first and second substrates are single-layer or multi-layer substrates.

10. The system of claim 1, wherein the metalized hole has an oblong shape.

* * * * *